(12) United States Patent
Vanfleteren et al.

(10) Patent No.: US 7,759,167 B2
(45) Date of Patent: Jul. 20, 2010

(54) METHOD FOR EMBEDDING DIES

(75) Inventors: Jan Vanfleteren, Gentbrugge (BE); Wim Christiaens, Brakel (BE)

(73) Assignees: IMEC, Leuven (BE); Universiteit Gent (RUG), Ghent (BE)

( * ) Notice: Subject to any disclaimer, the term of this patent is extended or adjusted under 35 U.S.C. 154(b) by 0 days.

(21) Appl. No.: 11/602,733

(22) Filed: Nov. 21, 2006

(65) Prior Publication Data
US 2007/0134849 A1 Jun. 14, 2007

Related U.S. Application Data
(60) Provisional application No. 60/739,372, filed on Nov. 23, 2005.

(51) Int. Cl.
*H01L 21/00* (2006.01)
(52) U.S. Cl. .................. 438/118; 438/106; 438/107; 438/110; 438/112; 438/113; 438/125; 438/126; 438/127
(58) Field of Classification Search .......... 438/106, 438/107, 110, 112, 113, 118, 125, 126, 127
See application file for complete search history.

(56) References Cited

U.S. PATENT DOCUMENTS

| | | | |
|---|---|---|---|
| 6,794,273 B2 | 9/2004 | Saito et al. | |
| 2003/0040164 A1* | 2/2003 | Inoue et al. | 438/438 |
| 2004/0023800 A1* | 2/2004 | Horii et al. | 503/227 |
| 2004/0214432 A1* | 10/2004 | Masumoto | 438/689 |
| 2005/0085034 A1* | 4/2005 | Akiba et al. | 438/232 |
| 2005/0202619 A1* | 9/2005 | Kodaira et al. | 438/197 |
| 2005/0224968 A1* | 10/2005 | Ho | 257/737 |
| 2006/0049530 A1* | 3/2006 | Hsu | 257/784 |
| 2006/0175701 A1* | 8/2006 | Gross | 257/734 |
| 2007/0000595 A1* | 1/2007 | Prack | 156/154 |

(Continued)

FOREIGN PATENT DOCUMENTS
EP 1230680 B1 8/2004

(Continued)

OTHER PUBLICATIONS
Niklaus et al., "Low-temperature full wafer adhesive bonding", Journal of Micromechanics and Microengineering, vol. 11, pp. 100-107, 2001.

(Continued)

*Primary Examiner*—N Drew Richards
*Assistant Examiner*—Jae Lee
(74) *Attorney, Agent, or Firm*—Knobbe Martens Olson & Bear LLP

(57) ABSTRACT

A method of manufacturing a semiconductor device is provided, involving forming a first flexible film on a rigid carrier substrate, attaching a die to the flexible film, so as to leave contacts on the die exposed, forming a wiring layer to contact the contacts of the die, and releasing the flexible film where the die is attached, from the carrier. An area of the first flexible film where the die is attached can have a lower adhesion to the rigid carrier substrate than other areas, so that releasing can involve cutting the first flexible film to release a part of the area of lower adhesion, and leaving an area of higher adhesion. A combined thickness of the die, the first flexible film and the wiring layer can be less than 150 μm, so that the device is bendable. Devices can be stacked.

22 Claims, 10 Drawing Sheets

U.S. PATENT DOCUMENTS

2007/0040258 A1* 2/2007 Sheats .................. 257/686
2007/0045875 A1* 3/2007 Farnworth et al. ......... 257/787

OTHER PUBLICATIONS

Christiaens et al., "UTCP : 60 μm Thick Bendable Chip Package", IWLPC 2006, Proceedings of the 3rd International Wafer-Level Packaging Conference, pp. 114-119, Nov. 2006.

Vandevelde et al., "Embedding of chips in flex and rigid substrates: impact on thermal and mechanical performance," 4th European Microelectronics and Packaging Symposium May 22-24, 2006, Terme Čatež, Slovenia, 147.

* cited by examiner covering PI layer: 20μm PI 2611 CTE: 3 ppm
inner PI layer: 30 μm HD 7012 CTE: 74 ppm
(30μm=thickness chip + BCB layer)
base PI layer: 20μm PI 2611 CTE: 3 ppm

METHOD FOR EMBEDDING DIES

CROSS-REFERENCE TO RELATED APPLICATIONS

This application claims the benefit under 35 U.S.C. §119 (e) of U.S. Provisional Application No. U.S. 60/739,372 filed on Nov. 23, 2005, the disclosure of which is hereby expressly incorporated by reference in its entirety and is hereby expressly made portion of this application.

FIELD OF THE INVENTION

This invention relates to methods of manufacturing semiconductor devices, methods of manufacturing stacks of such devices, to semiconductor devices having embedded dies, and to stacks of such devices.

BACKGROUND OF THE INVENTION

Miniaturization in modern day electronics is starting to shift from the chip level to the printed circuit board connecting the different chips. Embedding active components into printed circuit boards or even flexible substrates is a three dimensional solution to this interconnection problem. The benefits of 3D packaging in general and embedding active components in particular are: improved electrical and thermal performance, a higher degree of miniaturization, and more design flexibility. Traditional chip packaging technologies, using pins or solder balls, are in nature two dimensional solutions. Chips and the accompanying passive components are always placed next to each other, requiring space in between for the routing of the signal tracks. This planar approach limits the minimal length of the signal path. A straight-forward solution to this problem is a three dimensional packaging approach. This technology not only minimizes the length of the signal path, but also provides the possibility of placing termination and decoupling passive components close to the active die.

In EP 1230680 B1 a method for integration of a chip within a Printed Circuit Board (PCB), including at least a printed circuit board bottom layer and a further printed circuit layer, has been disclosed. The chip is permanently fixed to the printed circuit board layer and the composite structure is rigid, i.e., not flexible, due to chip and/or PCB thicknesses and properties.

In U.S. Pat. No. 6,794,273, a method of manufacturing a semiconductor device using a wiring substrate is shown, which includes the steps of:

a) forming a peelable resin layer on a silicon substrate, the peelable resin layer having a lower adhesiveness to the silicon substrate and being easily peelable from the silicon substrate;

b) forming the wiring substrate on the peelable resin layer;

c) mounting a plurality of semiconductor chips on the wiring substrate;

d) forming semiconductor devices by sealing the plurality of semiconductor chips by a sealing resin;

e) individualizing the semiconductor devices by dicing the semiconductor devices from the sealing resin side but leaving the silicon substrate;

f) peeling each of the individualized semiconductor devices from the silicon substrate such that the silicon substrate and the peelable resin layer are separated; and g) exposing terminals provided on the wiring substrate by forming openings through the peelable resin layer or by removing the peelable resin layer.

SUMMARY OF THE INVENTION

Improved methods of manufacturing semiconductor devices, methods of manufacturing stacks of such devices, semiconductor devices having embedded dies, and/or stacks of such devices are provided.

According to a first aspect, a method of manufacturing a semiconductor device is provided, the method having the steps of:

forming a first flexible film on a rigid carrier substrate, attaching a die to the flexible film, so as to leave contacts on the die exposed, forming a wiring layer to contact the contacts of the die, and releasing at least part of the flexible film where the die is attached, from the carrier substrate.

Compared to the above mentioned known process using a peelable resin layer, the distinctive feature of attaching the die before forming the wiring layer, is useful because non bumped dies need to be used. This can avoid precise flip-chip technology, using e.g. dies with fine pitches. It can also avoid the use of thermocompression during placing. Thus the methods of preferred embodiments can prevent or reduce the chance of breaking of the thin chips by executing pressure, e.g. on bumps. Also in accordance with the preferred embodiments, parallelism of the contacts of the chips is not so critical, e.g. as would be required for flip chip.

Any additional features can be added, and some such additional features are claimed in dependent claims and some are described in the embodiments illustrated.

The preferred embodiments include a method of manufacturing a semiconductor device having the steps of:

forming a first flexible film on a rigid carrier substrate, so that some areas of the first flexible film have lower adhesion to the rigid carrier substrate than other areas of the flexible film, attaching a die to an area of the flexible film having lower adhesion to the carrier substrate, and releasing at least part of the flexible film containing the die, from the carrier substrate. An advantage of the method is that after processing and before release from rigid carrier, the packaged die can easily be tested.

Another aspect provides a method of manufacturing a stack, having the steps of manufacturing a number of devices as set out above, and arranging the devices in a stack with electrical connections between different devices in the stack. The fan out pattern provides contacts with more relaxed pitches; this relaxes the alignment constraints of the individual dies. The fan out pattern enhances also the testability of the different dies, before stacking.

Heat removal can be improved or ensured by adding heat spreaders (e.g. metal such as Cu foils, or other heat spreading materials) between 2 chip packages. The individual packages are preferably very thin, so total thickness of stacked packaged dies will be comparable with total thickness of stacked bare dies.

Another aspect provides a corresponding device. The device can be a semiconductor device having a die embedded between layers of a flexible material, and having a wiring layer extending through the flexible material to contact contacts of the die, the die being sufficiently thin to enable bending of the device. A thermo-mechanical analysis has been done for calculation of the stresses caused by first processing succeeded by a mechanical bending. It is possible to manually bend this package with a curvature of about 5 mm without damaging either the silicon chip or the BCB layer: for a 25 μm thick packaged silicon chip, the tensile stress during bending the package with a curvature of is around 300 MPa, which is close to the ultimate stress for the silicon chip. Another aspect provides a stack of such devices.

Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the preferred embodiments can be put into effect will now be described by way of example with reference to the appended drawings, in which.

DETAILED DESCRIPTION OF THE PREFERRED EMBODIMENT

Figure 1:
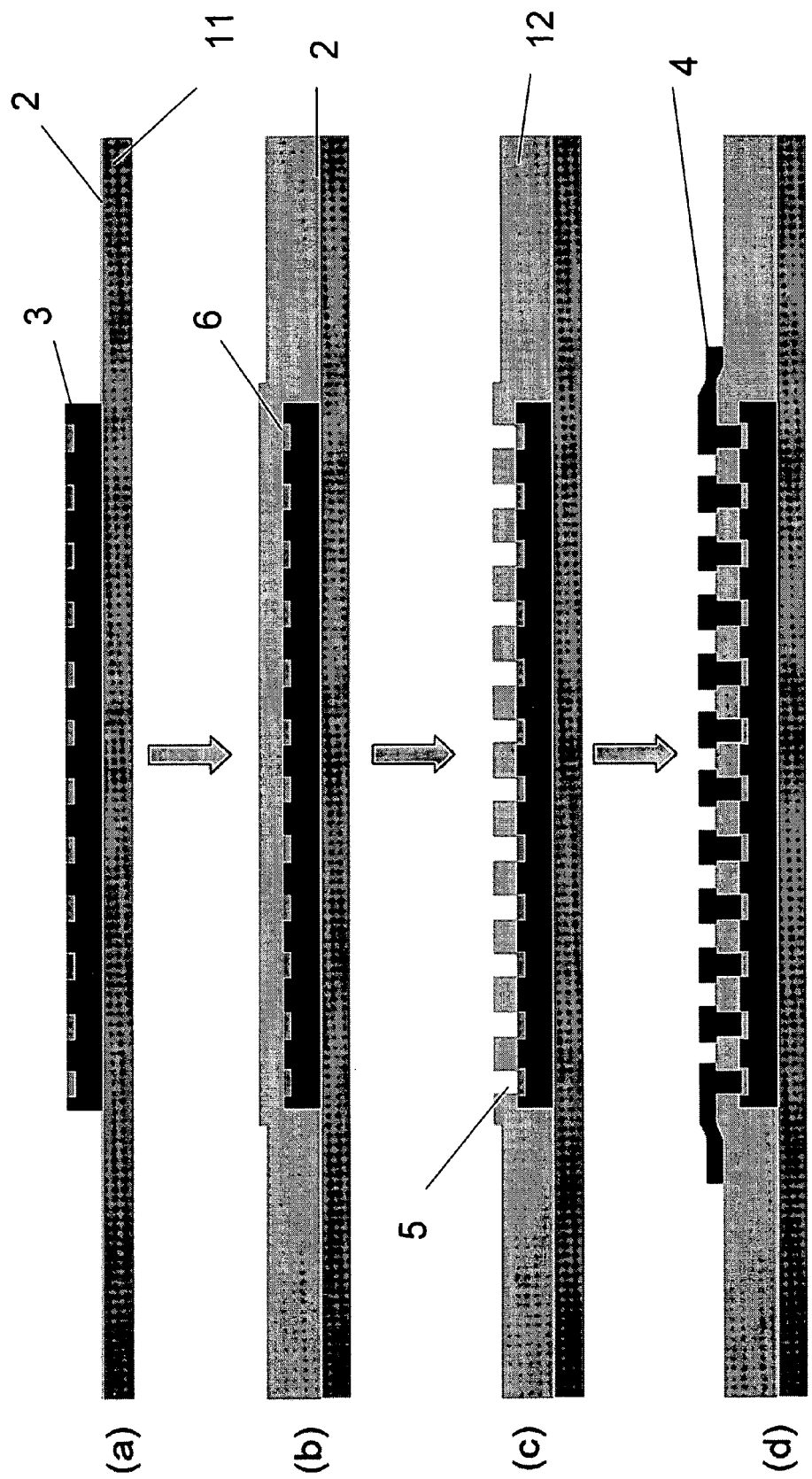
FIG. 1 shows an illustration of the process flow according to an embodiment.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the preferred embodiments, the only relevant components of the device are A and B.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

For the purpose of the description of the preferred embodiments, the wordings "die" and "chip" are used as synonyms.

Some of the embodiments to be described involve a process flow for embedding dies. Some involve a step wherein in a local area, e.g. just around the chip, an adhesion promoting surface or a promotor is applied and the chip is cut out within that area.

Additional features of some embodiments can include forming a second flexible film to cover the die after the die has been attached to the first flexible film, and forming holes in the second flexible film to leave the contacts exposed. Another such additional feature is a combined thickness of the die, the first and second flexible films and the wiring layer being less than 150 µm. Another such feature is adhering or gluing the die to the first flexible film.

Another feature is an area of the first flexible film where the die is attached having a lower adhesion to the rigid carrier substrate than other areas of the first flexible film.

Another feature is the releasing step involving cutting the first flexible film in the area of lower adhesion so as to release a part of the area of lower adhesion, and leave an area of higher adhesion.

Another feature is forming one or more recesses in the first flexible layer, and locating the die in one of the recesses. Another feature is the first flexible film being formed of polyimide. Another feature is the wiring layer comprising a fan-out of wires. The method of manufacturing a stack, can involve testing the devices after manufacture and before arranging them into a stack. Another additional feature is the device being substantially flat and having a thickness of less than 150 µm. The wiring layer can be arranged as a fan out, e.g. to form an interposer. An interposer is defined as a package for a die which has wiring to effectively extend or rearrange the location of or pitch between contacts of the die.

Multiple of these devices or interposers can be arranged as a stack.

A technology for flexible substrates not only offers the embedding of thin dies in flexible boards, but also an advantageous concept for packaging ultra-thin chips: the Ultra-Thin Chip Package (UTCP). This arises from consideration of the approach of embedding a bare die in the inner layers of a flexible board and to connect the pads of the chip with the wiring of the print on the flexible board. Possible problems with this option are the difficulty of testing of the dies before embedding (Known Good Die problem), the necessary precise placement of the bare die, and the need for very fine pitch PCB or FPC (flexible printed circuit), compatible with the pad pitch of the embedded chip. A different approach involves providing an "interposer", permitting the testing of the chip before embedding and providing a contact fan out with more relaxed pitches. This can reduce or eliminate the need for precise placement and ultra high density printed circuit boards. Of course in order to be able to embed a chip+interposer in the inner PCB or FPC layers, the unit itself should in many cases be extremely thin, using ultra-thin interposer layers and chips. Some embodiments of the Ultra-Thin Chip Packaging concept described can help achieve this.

FIG. 1

An overview of the process flow for a first embodiment of an ultra-thin chip package (UTCP) is shown step by step in FIG. 1. A brief overall description is followed by a more detailed explanation. The base substrates are an insulating layer of 20 μm or less on a rigid substrate. For example the base substrates can be a 20 μm polyimide layer spincoated onto a rigid glass carrier. For the fixation and the placement of the chips an adhesive can be used. The adhesive should preferably withstand the thermal budget of any subsequent processing. In a particular embodiment, bicyclobutane benzocyclobutene (BCB) can be used as the adhesive. The chip is covered with a 20 μm thick or less insulating layer such as a polyimide layer. For the contacting to the chip, contact openings to the bumps of the chips are laser drilled and a 1 μm or thicker (e.g. up to 25 μm or more) conductive layer such as a metal layer, e.g. TiW/Cu layer is applied or deposited e.g. by sputtering, evaporating, printing, plating electroless deposition or any other suitable method. The conductive layer is then patterned, e.g., photolithographically patterned. This conductive layer, e.g. metal layer provides a fan out to the contacts of the chips. Finally the whole package can be released from the rigid carrier.

This can enable embedding of thin dies or chips in flexible substrates. The dies or chips preferably have a thickness of from about 10 to 50 microns, more preferably from about 10 to 40 microns, and more preferably still from about 20 to 30 microns. The dies can be typically silicon or GaAs dies. For dies comprising other materials, other thickness parameters may be more appropriate.

The more detailed explanation of a process flow according to preferred embodiments now follows, based on the illustration in FIG. 1:

(a) Application, e.g. spin coating, spray coating, printing, dip coating and curing of a first uniform layer of a flexible and electrically isolating material, as for instance a first uniform polyimide (PI) layer (11), followed by application of either a uniform (by e.g. spin coating, spray coating, printing, dip coating) or a patterned (by e.g. dispensing or printing) adhesive layer, as for instance a Benzo Cyclo Butene (BCB) layer (2), followed by placement and fixation of the chip (3). The layers and chips are preferably applied on a rigid carrier substrate (1) (e.g. glass substrate or other rigid substrates known in the art, e.g. a silicon substrate) (not shown in FIG. 1). The thickness of the flexible layer should be such as to provide a good edge coverage.

(b) Application (for instance by spin coating and curing, spray coating, printing, dip coating) of a second layer of a flexible and electrically isolating material as for instance a second PI layer (12). This layer can be uniform. It can be uniform in the area above chip and uniform in the area surrounding the chip, e.g. optionally having different thicknesses in both areas.

(c) Opening of the chip contacts by for instance laser via drilling, hereby defining contact holes (5) in said second layer of a flexible and electrically isolation material as for instance a second PI layer (12). Via formation can be done by laser drilling, e.g., using (frequency tripled) YAG, excimer, $CO_2$, laser or any other form of bundled energy. Alternatively any form or wet or dry etching can be used.

(d) Metallization (e.g. by sputtering, evaporating, printing, plating, electroless deposition, or similar) and photolithographic patterning of the contact metal (4), providing a fan-out for the chip contacts (6).

Then the whole package (polyimide layers+embedded chip+fan-out metallization) is released or lifted-off from the rigid substrate. Chip, PI layers and metal are preferably to be chosen to be so thin, that the whole package is bendable without breaking (see FIG. 6).

FIG. 2

Figure 2:
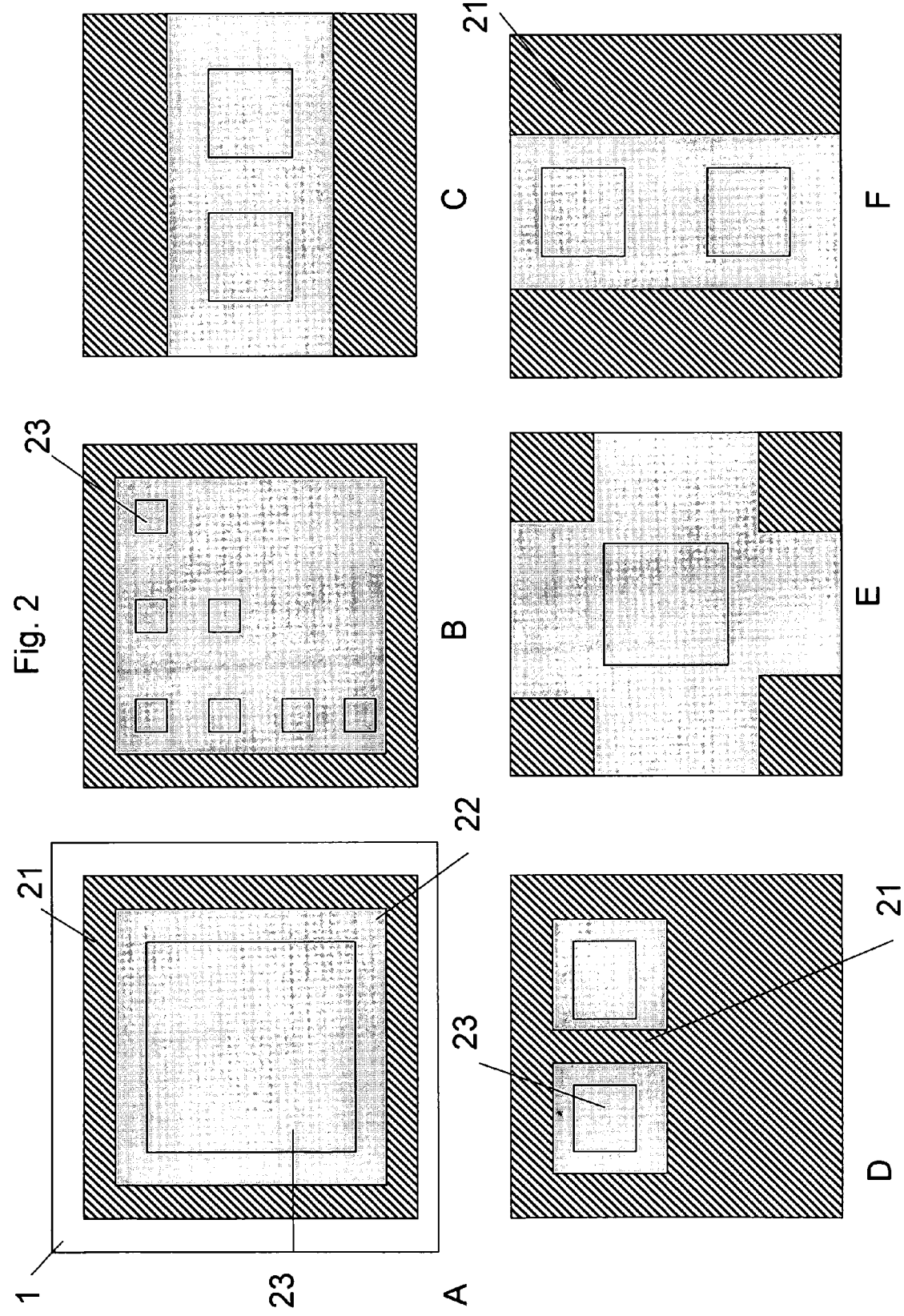
FIG. 2 shows a plan view of various embodiments, whereby the dies are temporarily bonded to a first layer of flexible and electrically isolating material which is bonded to a rigid carrier substrate, and whereby only a part of the carrier substrate is covered with an adhesive or glue, such that area of low bond strength and areas with a strong bond strength are formed. The areas of low bond strength can be used to position and embed chips.

In some embodiments, the step of releasing of the package from the rigid substrate is carried out in a certain manner. Before applying (e.g. spin coating) the first layer of flexible and electrically isolation material as for instance an PI layer, only a part of the glass substrate (e.g. the 4 edges of a square glass substrate) is treated e.g. coated with an adhesion promotor or surface treated to provide an adhesion promoting surface by any other suitable means. The consequence of this is that the first layer of PI adheres well to the edges of the substrates, and has marginal adhesion strength to the centre of the substrate, i.e. the area where no adhesion promotor has been applied or no adhesion promoting surface has been created. This aspect is illustrated in FIG. 2, wherein different examples (A-F) are shown for the distribution of areas with good adhesion (21) and areas of marginal adhesion (22 (including chip areas (23))). Also other distributions and pattern are possible.

In the given examples the area of good adhesion lie at the edges of the carrier substrate, but this is not necessary, although preferred. The carrier substrate 1 is depicted in FIG. 2 A only, as an illustration. In preferred embodiments the areas of good adhesion are surrounding the areas of marginal adhesion in plane. Different dies can be surrounded by a single area of good adhesion. The examples moreover show areas of good adhesion and areas of less or marginal adhesion defined by squares or rectangles; this is for illustration only and different shapes are possible.

However the adhesion in the areas of good adhesion, as for instance near the edges is chosen such that it is sufficient to allow for the whole process cycle (a) through (d) as described above. After processing, the package can be cut out in the area of marginal adhesion and thus peel off easily from the rigid substrate. The cut can be a circumferential cut surrounding one or more embedded dies, within the area of marginal adhesion.

Figure 10:
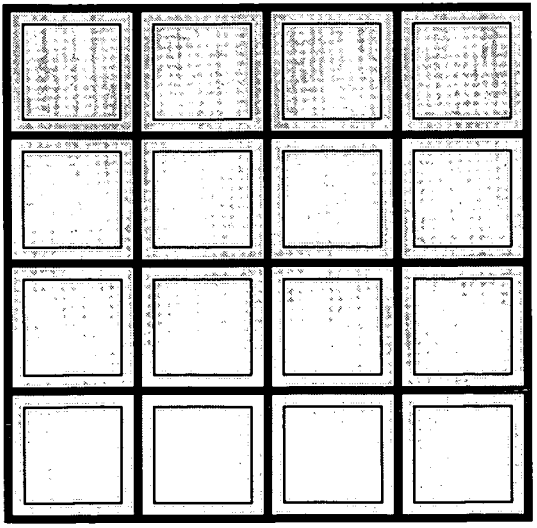
FIG. 10 shows a layout of adhesive

Different patterns of adhesion promotor or adhesion promoting surface patterns are shown in FIG. 2 and FIG. 10. This is for illustration only and other and/or different patterns are also within the scope of the preferred embodiments. FIG. 2 B, C, D and F and FIG. 10 show possible patterns in order to produce different single chip packages on a common rigid carrier substrate. For larger carrier substrates it can be necessary to apply an adhesion promotor or to provide an adhesion promoting surface not only on the edges of the carrier substrates but in pattern as shown in FIG. 10 in order to have more firmness during the whole process cycle as described above. In principle one can apply an adhesion promotor or to provide an adhesion promoting surface on the carrier substrate everywhere there will be no metal pattern.

These patterns of adhesion promotor or adhesion promoting surface patterns can also be used to produce multi-chip packages, i.e. packages embedding two or more chips together in between the two flexible layers in one package (cases B, C and F in FIG. 2). The metal layer can interconnect the different chips.

In alternative embodiments the areas of good and marginal adhesion between the first layer of flexible and electrically isolation material and the carrier substrate can be produced differently. The natural adhesion between the first layer of flexible and electrically isolation material and the carrier substrate, for a given set of first layer of flexible and electrically isolation material and carrier substrate, can be such that it is of good adhesion quality. In such a case the area of less or marginal adhesion can be provided by applying an adhesion inhibitor or by surface processing to generate an adhesion promoting surface.

Deposition of adhesion promotor on small (carrier) substrates can involve any suitable method of which the following are examples:

Dipcoating of the glass substrate in the adhesion promotor, or dispensing of adhesion promotor on the edges of the substrate, or printing of adhesion promotor on the edges of the substrate. Spincoating of adhesion promotor can involve applying a protective layer in the middle of the substrate which is removed after the adhesion promotor deposition.

Deposition of adhesion promotor on larger substrates can involve dispensing of adhesion promotor, or printing of the adhesion promotor.

Spincoating of adhesion promotor can involve a protective layer being patterned on the substrate surface and removed after adhesion promotor application.

Another alternative deposition pattern is shown in FIG. 10. This can involve dispensing/printing/ . . . small lines of adhesion promotor all over the substrate, in a grid pattern for example or in other patterns. This can give an optimal use of the surface and can be applied on larger substrates.

Figure 6:
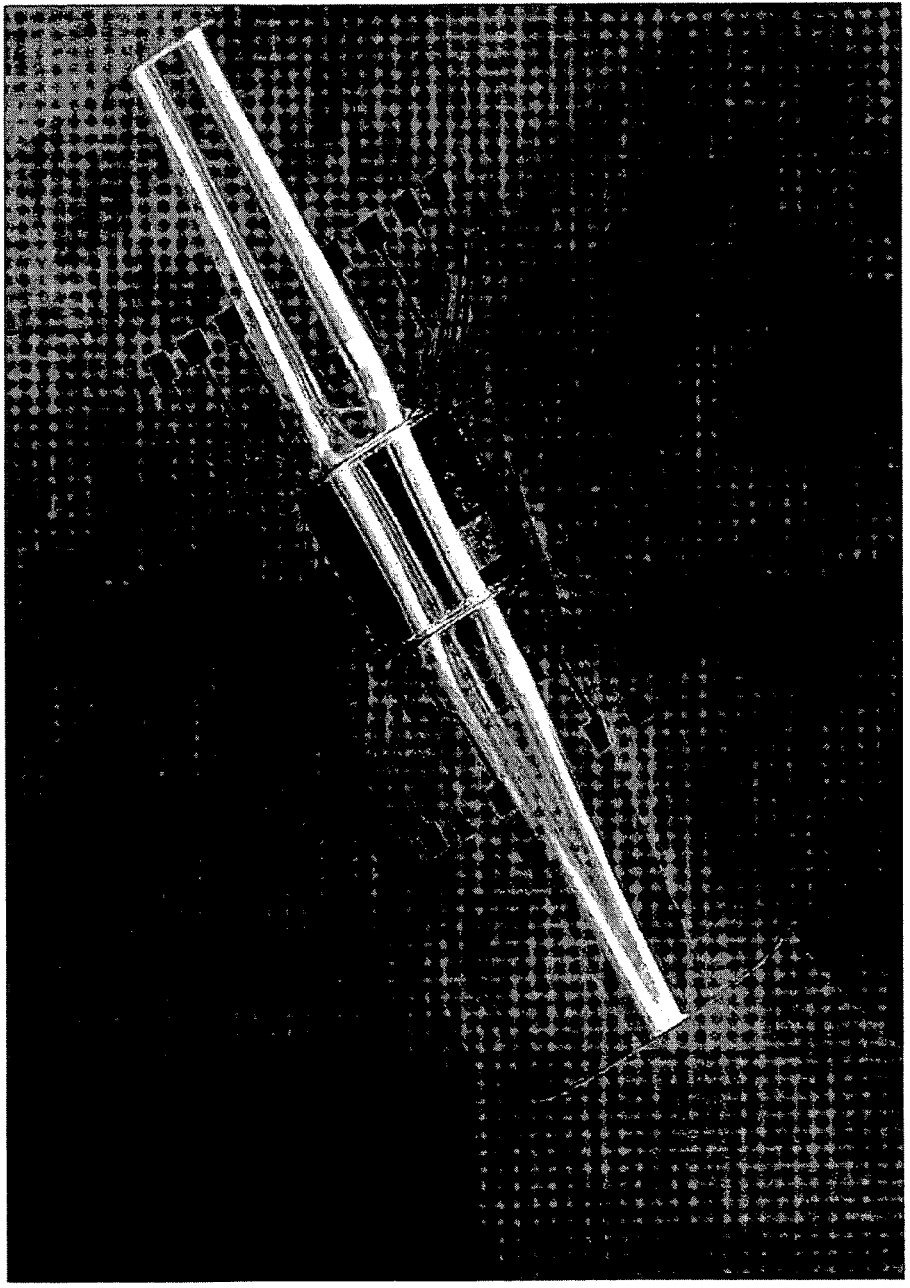
FIG. 6 shows a view of an embodiment wherein the device is bent to illustrate the foldability of the thin chip package.

Typical thicknesses for the different layers are:
first layer and second layer of flexible electrically isolating material as for instance PI: 10-20 µm, although different thicknesses are also possible. They should be such that the chips are embedded completely by e.g. the PI layers.
adhesive layer as for instance BCB: <10 microns, preferably <5 µm
Chip as for instance silicon chip or die: 10-50 µm, more preferably from about 20-30 µm, such that it is sufficiently flexible to be bent as shown in FIG. 6 for example.
Metallization: <=1 µm (or <1 micron), or thicker, e.g., 25 micron or more.

This can result in a very thin flexible chip package, e.g. down to 50 µm thickness and less. Such a thin and foldable package, a combination of ultra thin chips and ultra thin embedding layers, has not been shown in the prior art.

The embedded die can be used as a package, e.g. solder balls can be placed on the contacts and the package can be solder assembled on interconnection substrates (PCB or flex) like a common component using standard assembly technologies.

Alternatively the ultra thin package can be embedded in a stack of PCB layers, replacing for example also the naked die, with the advantage that alignment constraints for the embedded package are not as severe as for the embedded die as the fan out provides contacts with more relaxed pitches. Moreover the "Known Good Die" (KGD) issue is mitigated or solved as the package surrounding the chip can be tested before embedding the package.

The process flow provides also an alternative for the application of driver chips to certain types of flexible displays. In certain technologies a base polyimide layer is applied on a rigid substrate, followed by a complete processing of an active matrix of thin-film transistors (TFTs), where each TFT cell addresses 1 pixel in the display.

Normally rows and columns of such a display are driven by external semiconductor, e.g. Si, chips, which are packaged in TCP (tape carrier package) or COF (chip on film) format and attached to the display substrate using adhesives or solders. This technology provides another solution, namely embedding the driver chips in the polyimide base substrate, before processing of the active matrix. This results in an enhanced flexibility of the display module and a strongly reduced number of interconnection from the display substrate to the external driver electronics.

As has been described, this ultra thin package can be embedded in a stack of PCB or FPC layers or can be used as a flexible chip in for example smart textiles. The new concept of packaging ultra-thin chips can result in a flexible packaged die of only 50 to 60 µm. Vias with diameters down to 35 µm can be realized using a tripled YAG laser (or any other method as indicated above), enabling chips with contact pitches down to 60 µm. The new process flow can provide an interposer to permit testing of the chip before embedding and can provide a contact fan out with more relaxed pitches between contacts.

They can find application in for example smart systems such as smart textile and flexible displays. Furthermore, such ultra-thin chips can be embedded into flexible and rigid boards enabling system miniaturization. The new process flow realizing ultra-thin chip packages can have ultra-thin chips of only 20 to 30 µm, packaged in between 2 polyimide layers, resulting in a 50 µm-thick bendable packaged die.

Stacking of chips in 3 dimensions is already used to enable system miniaturization. One of these 3D-stacking approaches is embedding of chips into printed circuit boards (PCB) or flexible printed circuits (FPC). This can be done by embedding the bare die in the inner layers of the rigid or flexible board and connecting the chip pads with the wiring of the print. An alternative approach is to provide an interposer substrate for the die before embedding. This has the advantage that the chip can be tested before embedding (known good die problem). Furthermore, a contact fan out with more relaxed pitches can be provided, which eliminates the need for precise placement and ultra high density PCBs. However, this approach can only be used if the die and interposer layers can be made ultra thin.

As has been described, the flexible layer can be in the form of a base substrate of a 20 µm polyimide layer, spincoated on a rigid glass carrier which is removed at the end of the process. Silicon chips, thinned down to 20-30 µm and with 100 µm contact pitch for example, are placed onto this polyimide substrate. Benzocyclobutene (BCB) can be used as adhesive because it offers high bond strength and can resist to the high curing temperature of the top polyimide layer. Another advantage of using BCB as adhesive is that it allows for void free bonding. After the chip is fixed to the polyimide layer, a second polyimide layer (20 µm) is spincoated to cover the chip. To ensure good adhesion between top and bottom polyimide layer, the cured bottom layer is first plasma treated ($CHF_3/O_2$ and subsequent $O_2$ plasma treatment). Other adhesion promoting techniques can be applied such as other plasma treatments, chemical modification, application of an adhesion promotor, or sputter etching. Next, contact openings to the bumps of the chips are realized through the top polyimide layer. Small microvias with top diameter down to 35 µm can be realized using laser drilling with a tripled YAG laser with a shaped beam (or by any other suitable method as indicated above). Finally, a top metal layer (1 µm TiW/Cu) is sputtered, metallizing the contacts to the chip and providing a fan-out. The result is a 50 µm thick chip package.

Process Flow

Preparation of the Substrates

The base substrate is a 20 μm polyimide layer spincoated on a rigid glass carrier. This can be carried out as 4 layers each of 5 μm for example. After cure and plasma treatment of first PI layer, the next PI layers are spincoated. The polyimide used for this is PI 2611, from HD Microsystems, though other materials can be used.

After processing the package has to be released from the rigid carrier. An easy release of the package from the rigid substrate can be obtained in a special way: before spinning the first polyimide layer, the 4 edges of the square glass substrate are coated with an adhesion promotor. A consequence of this is that the first layer of polyimide adheres well to the edges of the substrates, and has marginal adhesion strength to the centre of the substrate. However the adhesion to the edges is sufficient to allow for the whole process cycle of steps (701) through (706) as described in FIG. 7.

After processing the package can be cut out in the area of marginal adhesion and thus peels off easily from the rigid substrate.

Chips

The chips can be silicon chips thinned down to 20-30 μm, for example. Chip size can be 5×5 mm also larger or smaller, or 4.9×4.9 mm providing a daisy chain with 176 pads. The contact pitch is 100 μm. The pad metallization is an electroless Ni/Au flash, with a thickness of 3 μm, and contact pitch of 100 μm for example. Also chips with other metal finish can be used.

Fixation of the Chip

An adhesive material is preferred for the fixation of the ultra-thin chips on the base polyimide layer. The adhesive is preferably resistant to the high curing temperature of the top polyimide, PI2611 (350° C.). Benzocyclobutene (BCB) and polyimide can be used as bonding material. A number of polymers were tested as adhesive bonding material: polyimides PI 2610 and PI 2611 (both from HD Microsystems) and the BCB Cyclotene 3022-46 (DOW). They can be dispensed or spincoated.

It can be important for some applications to prevent void formation at the bond interface. Voids can be caused by small air bubbles, trapped between the adhesive layer and the surface of the chip. These bubbles can be prevented by placing the chips in a vacuum environment during bonding. Another possible solution could be found in dispensing a well controlled amount of the adhesive. While placing the chip the dispensed adhesive flows from the middle of the surface to the edges of the chip without air at the interface.

Voids can also be created during the curing of the tested polymer: evaporating solvents create bubbles. Using BCB material, this can be solved with a pre-curing of the adhesive BCB layer before bonding: all solvents can be evaporated during this pre-curing. With the tested polyimides PI2610 or PI2611 as adhesive materials, even a pre-cure does not prevent voids evolving during the curing of the polyimide. This can be explained by the difference in curing mechanism of BCB and the tested polyimides. BCB does not produce any byproducts that are released during the curing process (if solvents are evaporated during a precuring).

During the imidization process of the tested polyimides water is sublimated as byproduct, also solvents evaporate during the curing process. Also the application of a minimum bonding pressure is required to achieve void-free bonds, as shown in F. Niklaus, P. Enoksson, E. Kalvesten and G. Stemme, "Low-temperature full wafer adhesive bonding", Journal of Micromechanics and Microengineering, Vol. 11, pp. 100-107, 2001. So BCB is suitable to be used as adhesive to glue the chip on the polyimide layer: the solvents of the BCB evaporate during a pre-curing and when the chips are placed properly (in vacuum or with a dispensed BCB) void free bonds can be obtained. To further optimize chip placement on dispensed (pre-cured) BCB, and to reduce or avoid voids, it would be feasible to control the dispensed quantity of BCB. (This way there would not be a need a vacuum environment.)

Figure 3:
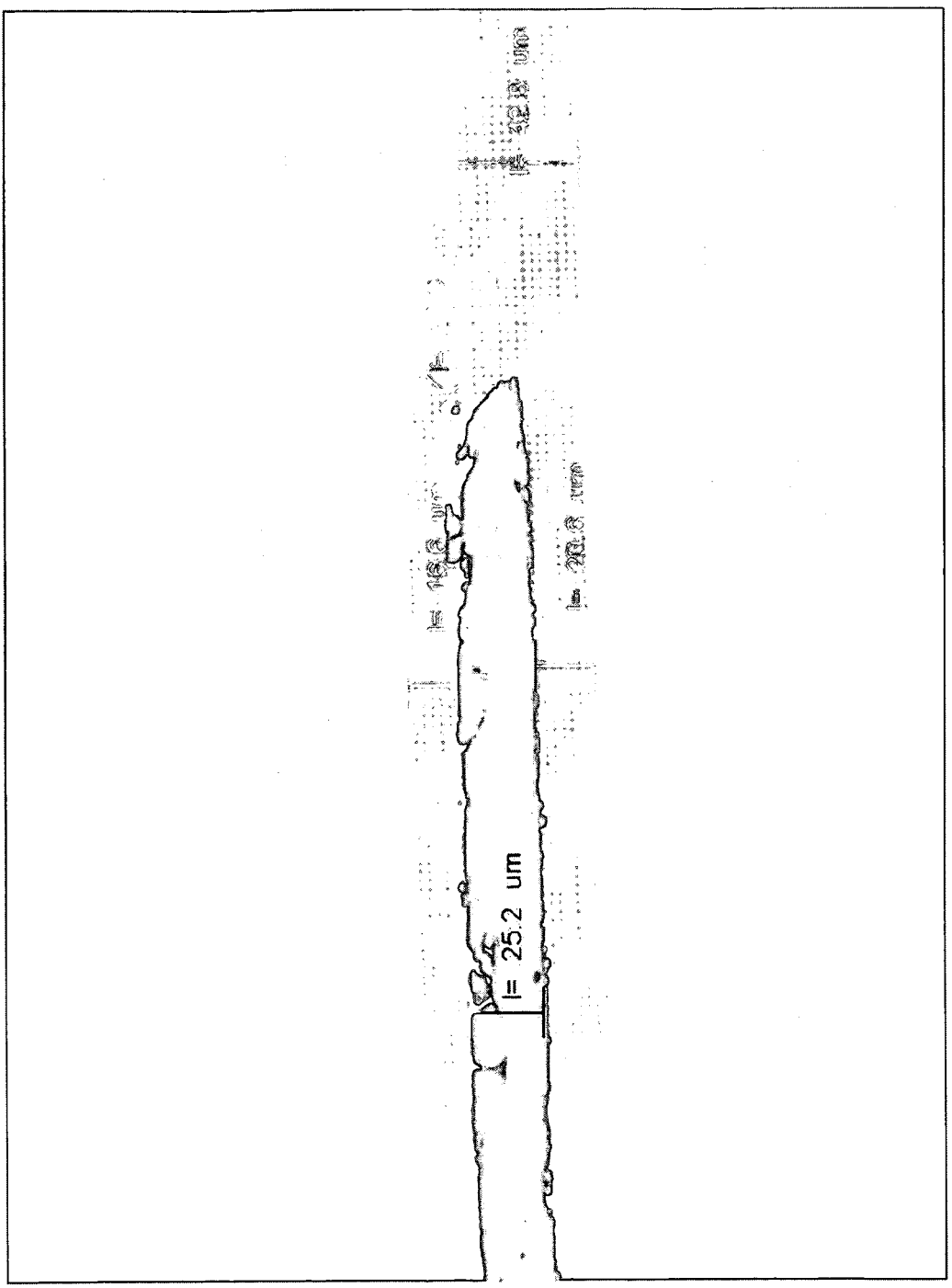
FIG. 3 shows in cross section view a 25 µm thick embedded chip, embedded according to a method of a preferred embodiment, resulting in 60 µm thick chip package (laser drilled via holes and metallization are not visible).

FIG. 3—Covering the Chip

After the cure of the BCB at 350° C., the chip is fixed on the polyimide layer. Then a covering polyimide (PI2611) layer is spincoated on this fixed die, with a thickness of 20 μm. In order to obtain a good adhesion between the top polyimide layer and the (cured) base polyimide, this cured polyimide should be pre-treated. For example, before the spincoating of the top polyimide layer the cured layer is first plasma-treated for 2 minutes in a $CHF_3/O_2$ plasma followed by 2 minutes in an oxygen plasma treatment. The cross section shown in FIG. 3 shows an example having good edge-coverage of the spincoated top polyimide layer. The embedded die shown in FIG. 3 has a thickness of 25 μm, packaged in between 2 16 μm and a 20 μm polyimide layer. The thickness of the covering polyimide at the edges of the chip is 12 μm.

Contact Opening

Contact openings to the bumps of the chips are laser drilled through the top polyimide layer. Laser drilling has emerged as the most widely accepted method of creating microvias in high-density electronic interconnect and chip packaging devices. UV lasers are known for high precision material removal and their ability to drill the smallest vias. The UV lasers have also the ability to effectively ablate metal layers; this also means that measures must be taken to avoid too much laser damage to the metallization of the bumps of the chip. Any other suitable method may be used for forming the vias as indicated above.

Laser drilling tests were performed with two different UV lasers: a 248 nm KrF excimer laser and a frequency tripled Nd-YAG-laser, working at 355 nm. Three different set-ups were compared: excimer laser; YAG-laser with Gaussian beam; and YAG-laser with shaped beam.

Using the tripled YAG-laser with a shaped beam means using beam-shaping optics to transform the natural Gaussian irradiance profile to a near-uniform "top hat" profile. This imaged beam removes the polyimide material uniformly across the via, without creating undesirable underlying metal damage at the centre of the imaged spot (which is difficult to control with a Gaussian beam). It is also shown that substantially less irradiance dose is required for drilling when using the reshaped beam profile. A lower irradiance dose reduces considerably the thermal load on the material and improves dramatically the overall hole quality (and reduces the debris). Due to the uniform profile of the beam also the tapering can be better controlled. Via diameters with a top diameter down to 20 μm can be realized with shaped beam.

Figure 4:
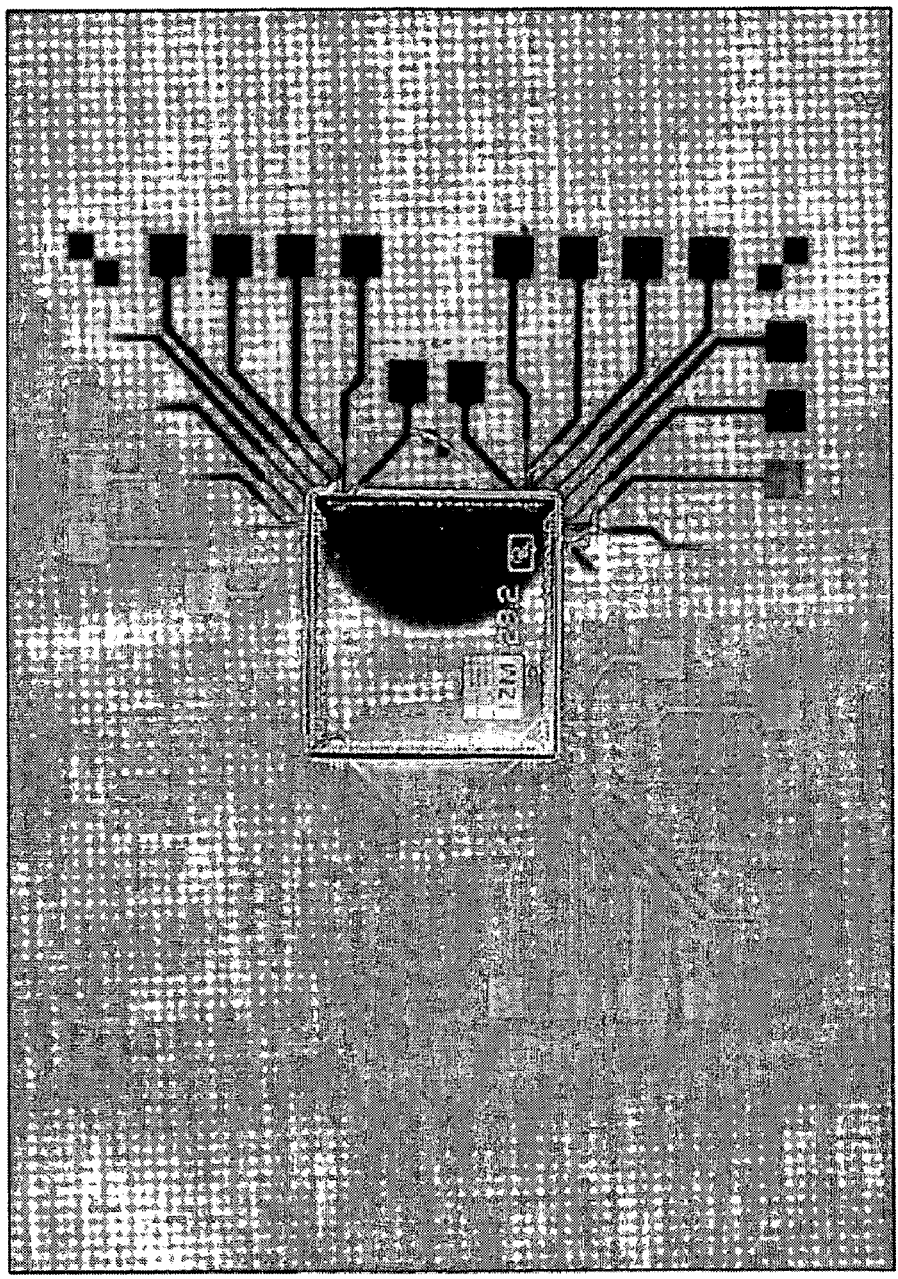
FIG. 4 shows a realization of an embedded chip with fan-out metallization.
Figure 5:
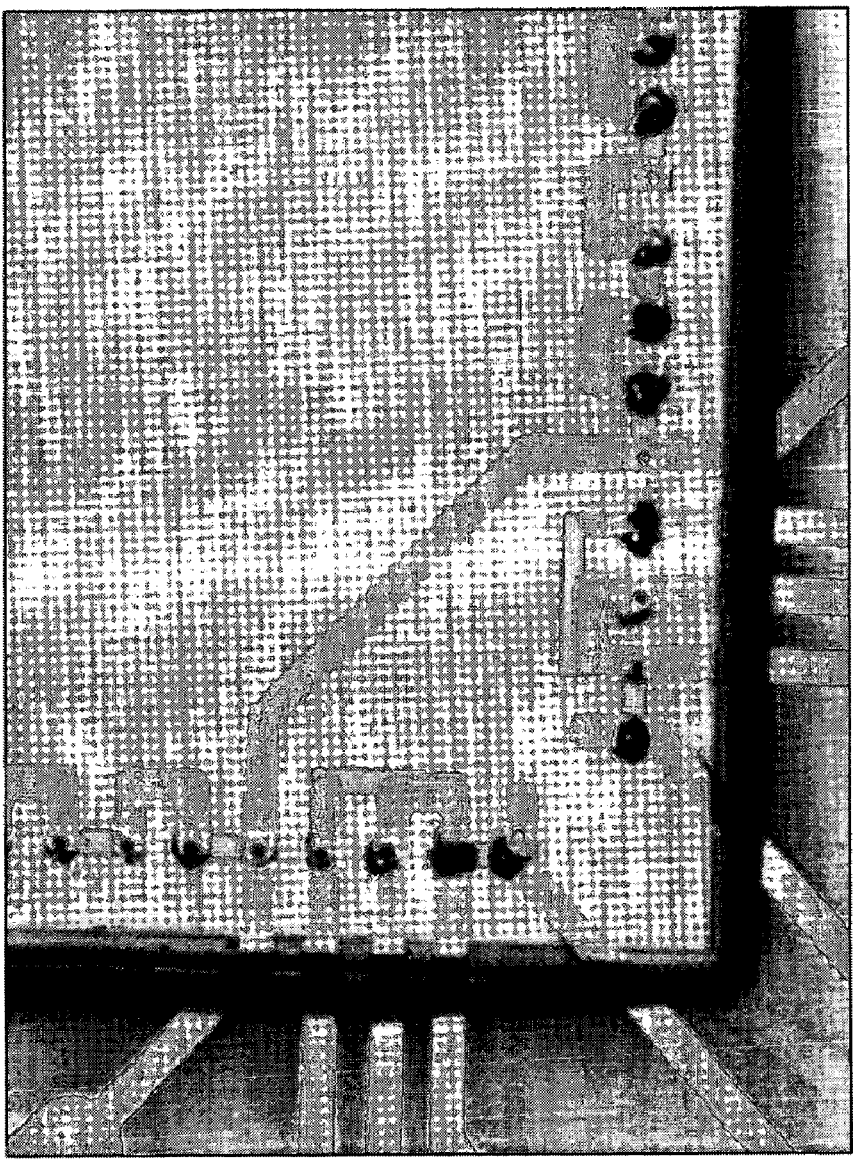
FIG. 5 shows detail of FIG. 4, showing metallized via holes.

FIGS. 4 and 5—Top Metallization

A top metal layer is sputtered, metallizing the contacts to the chip and providing a fan-out (see FIG. 4). This can involve 50 nm TiW+1 μm Cu sputtered or other arrangements. The metallization can be patterned using conventional techniques. A photolithographic patterning can involve the following steps: application of photoresist; illumination through metal mask; developing of illuminated photoresist; metal etch, (Cu: etched with a $FeCl_3$ based etchant): ARDROX PC 1144 (BRENT); TiW: etched in $H_2O_2$; and photoresist strip.

Adhesion of metal layer on spin-on PI: different plasma etching treatments were tested. Metallization was realized by sputtering a 1 µm TiW/Cu layer. In order to have optimum adhesion strength of the sputtered TiW/Cu layer on the top polyimide, reactive ion etching RIE was tested on spincoated polyimide layers as pre-metallization surface treatment.

Three different plasma treatments were tested: CHF3/$O_2$ (4/1) gas mixture; $O_2$ plasma; and $CHF_3/O_2$ plasma+$O_2$ plasma Polyimide was spincoated on glass-substrates, plasma treated and then metallized with a 1 µm sputtered TiW/Cu layer. All the samples passed the Scotch-tape test. In order to perform a peel strength test the copper had to be plated up. The sputtered copper was plated up to a 25 µm copper thickness and then photolithographically patterned. The measured peel strength on the samples treated with a $CHF_3/O_2$ plasma+$O_2$ plasma was higher than 1.6 N/mm and the peel strength of the metallization on the oxygen treated polyimide was even higher than 2 N/mm.

Finally the whole package (polyimide layers+embedded chip+fan-out metallization) is released from the rigid substrate. Chip, PI layers and metal are so thin, that the whole package is bendable. A thermo-mechanical analysis has been done for calculation of the stresses caused by first processing succeeded by a mechanical bending. It is possible to manually bend this package with a curvature of about 5 mm without damaging neither the silicon chip nor the BCB layer: for the a 25 µm thick packaged silicon chip, the tensile stress during bending the package with a curvature of is around 300 MPa, which is close to the ultimate stress for the silicon chip.

Figure 7:
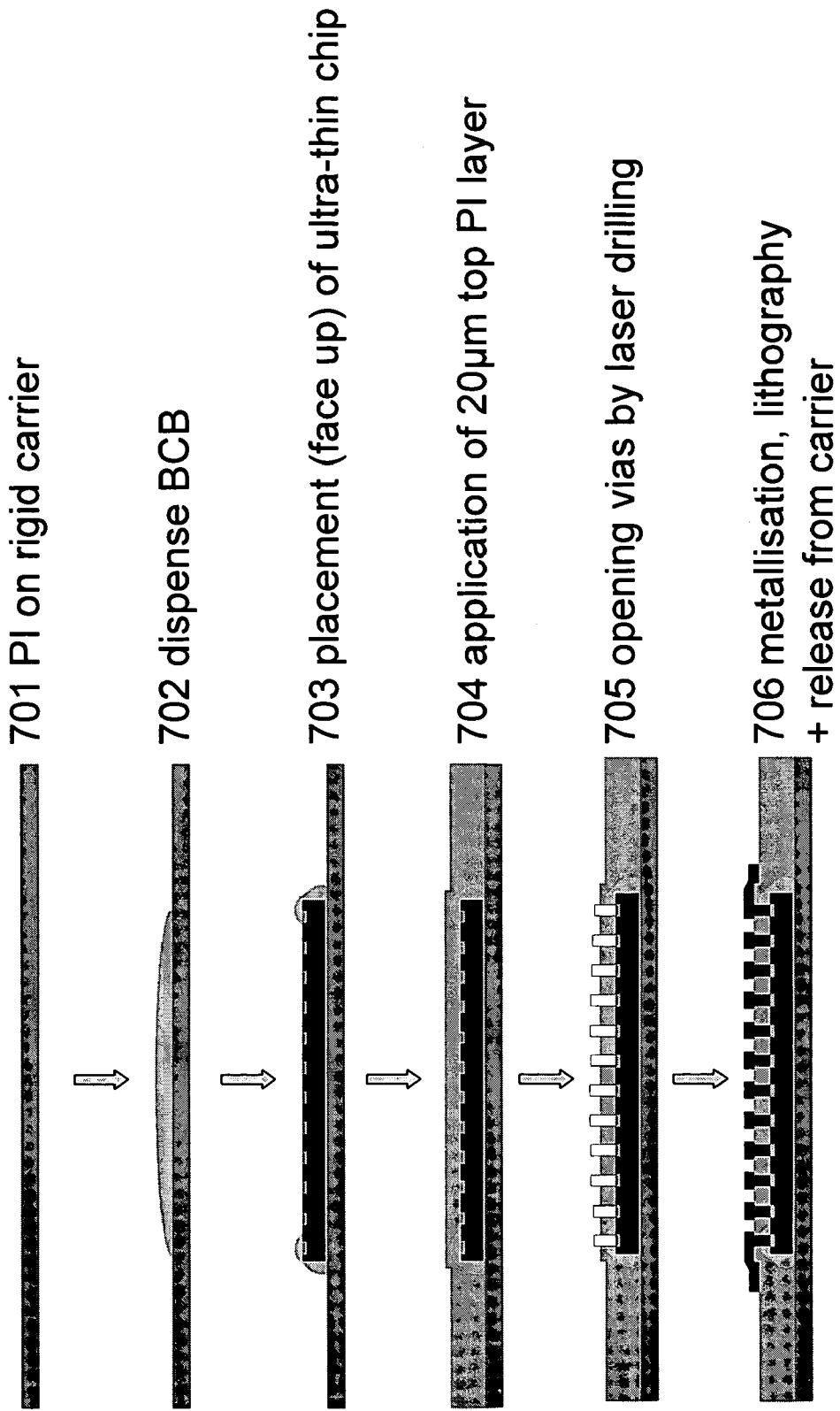
FIG. 7 shows a process flow according to another embodiment.

An overview of another embodiment of the process flow for the ultra-thin chip package (UTCP) is shown in FIG. 7, similar to that of FIG. 1. Step 701 shows PI formed on a rigid carrier. Step 702 is dispensing of adhesive such as BCB. Step 703 shows placement (face up) of an ultra-thin chip. At step 704 application of 20 µm top PI layer is shown. Opening vias by laser drilling is shown in step 705 (any other suitable method may be used). Step 706 shows metallization, lithography and then release from a carrier. The base substrate can be a 20 µm polyimide layer spincoated on a rigid glass carrier. For the fixation and the placement of the chips a benzocyclobutene (BCB) is used as adhesive. The chip is covered with a next 20 µm thick polyimide layer. For the contacting to the chip, contact openings to the bumps of the chips are laser drilled and a 1 µm TiW/Cu layer is sputtered and photolithographically patterned. This metal layer provides a fan out to the contacts of the chips. Finally the whole package can be released from the rigid carrier.

FIG. 8

Figure 8:
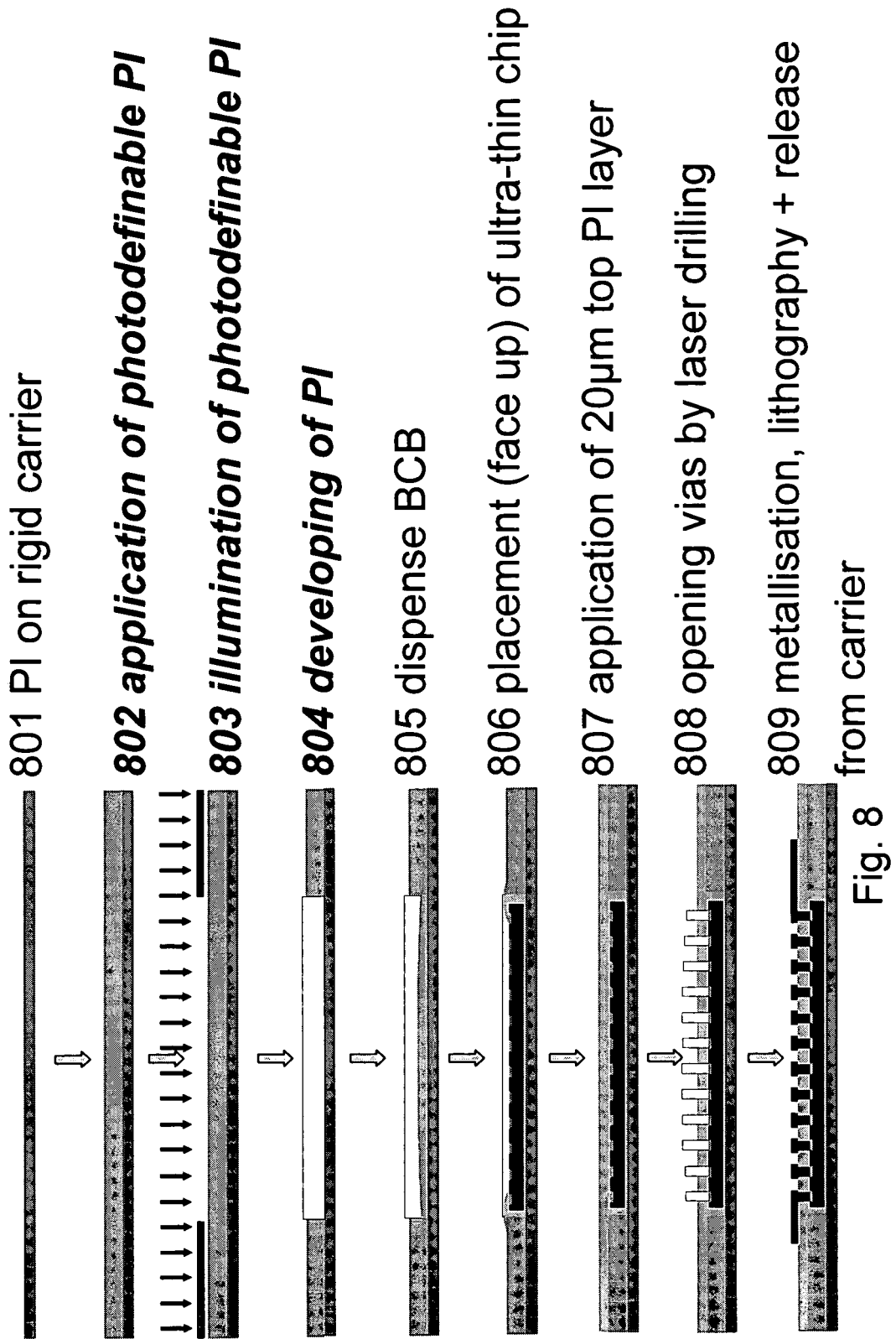
FIG. 8 shows a process flow according to another embodiment.

FIG. 8 shows another embodiment of a process flow. This has similar steps to that of FIG. 7, with the addition of steps for photo defining one or more cavities in the PI layer. This involves additional steps after the step of applying PI on the rigid carrier.

A layer of photodefinable PI is applied, followed by a mask. Illumination of the photodefinable PI through the mask is carried out. The photodefinable PI is developed, to leave cavities in the form of areas of thinner PI, recessed below the top surface. The subsequent steps of dispensing adhesive such as BCB, can be carried out in these cavities.

This process flow makes it possible to produce real flat chip packages. This process is based on a photodefinable polyimide. Cavities can be defined in this extra photodefinable spin-on polyimide layer and the chips are placed and fixed in these cavities. The polyimide HD-7012 (HD Microsystems) or other photodefinable flexible materials can be used for this purpose. It has typical cured film thickness between 20 and 70 µm. The thickness used in this embodiment is about 30 µm, so that the thickness of the chip plus the thickness of adhesive fill the cavity. A suitable sequence of process steps for this flat UTCP is shown in steps 801 to 809 as shown in FIG. 8. The base substrate is a uniform polyimide layer (PI2611), applied on a rigid carrier. Next, a 30 µm photodefinable polyimide (PD PI) layer is spin coated. After the prebake, the PD PI is exposed. The unexposed regions are etched away by the developer (PA400D, rinse with PA400R), defining the cavities in the PD PI layer.

After cure of the PD PI, the ultra-thin chip is placed and fixed in the cavity. The chip and the adhesive are filling the cavity. Next, the top polyimide is applied, via openings are laser drilled (any other suitable method may be used as indicated above) and the TiW/Cu is sputtered. After patterning of the metal layer the flat package can be released from the carrier.

This alternative process places the thin dies in cavities, so that the packages are flatter. An advantage of these flat UTCP's is that the flatness makes them more suitable for stacking in order to obtain 3D type chip packages. Parameters can be varied to try to optimize adhesion between different PI types, for example between the PI 2611 of the lower layer and HD-7012 of the photo defined layer, after surface plasma treatment for example.

FIG. 9

Figure 9:
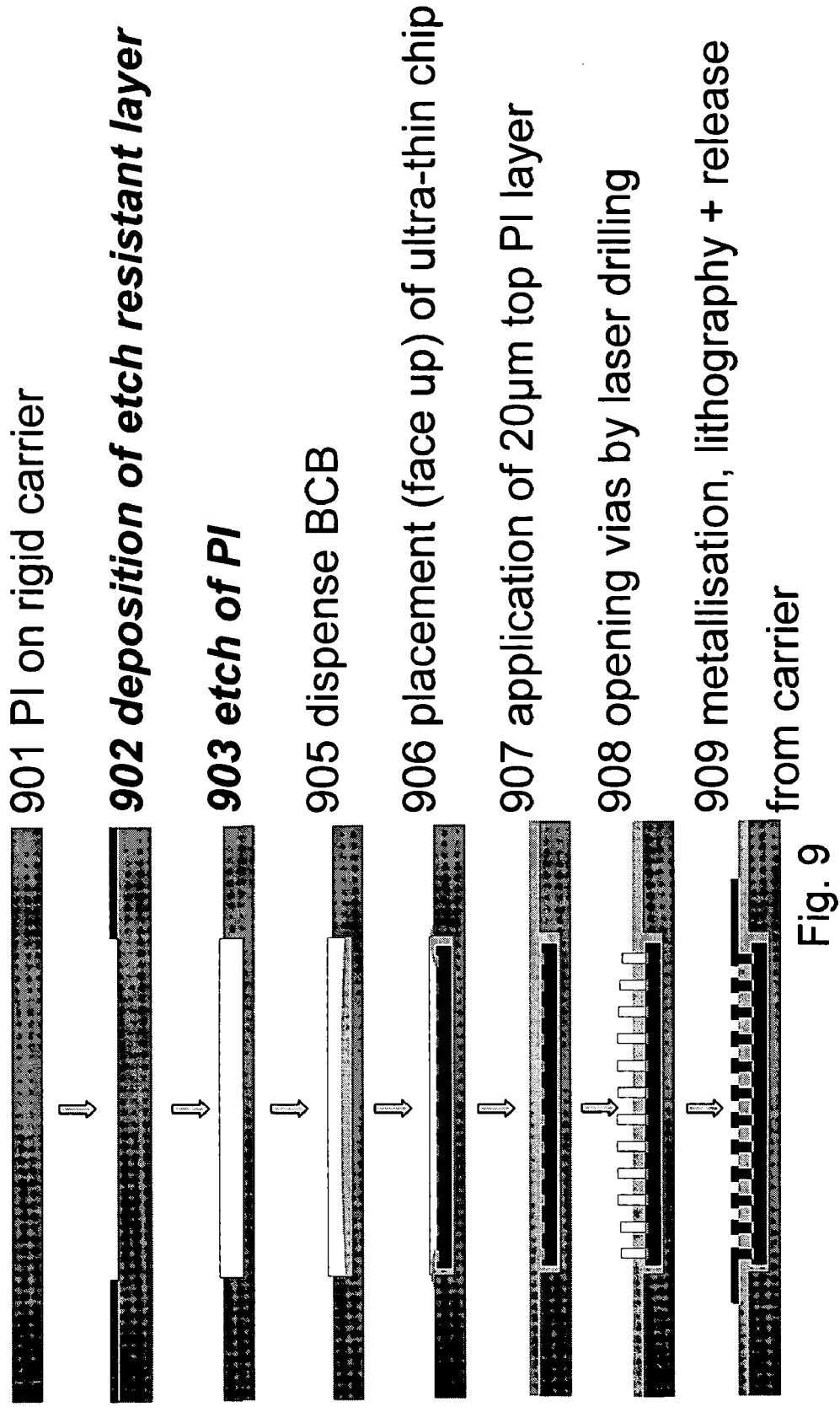
FIG. 9 shows a process flow according to another embodiment.

FIG. 9 shows another embodiment of a process flow in accordance with another embodiment. This has similar steps to that of FIGS. 7 and 8, with the addition of steps for photo defining one or more cavities in the PI layer. This involves additional steps after the step of applying PI on the rigid carrier.

The first flexible layer is now thicker. Cavities will be defined in this layer. First an etch resistant material (e.g. a metal mask) is applied and patterned. The next step is the etching (dry or wet) of the first layer, to leave cavities in the form of areas of thinner PI, recessed below the top surface. So the first layer is only partially etched in the areas where the cavities are defined. The subsequent steps of dispensing adhesive such as BCB, can be carried out in these cavities. The advantage over the method, as outlined in FIG. 8, is that only two flexible layers are used for producing a flat package. Moreover no photodefinable polyimide has to be used which (1) is considerably more expensive than the non-photodefinable variant (2) has a CTE (74 ppm/deg C.) strongly different from that of Si and the non-photodefinable variant (3 ppm/deg C.), thus avoiding induced stresses during cooling down after thermal curing and induced curling of the produced thin chip package after removal from the carrier.

FIG. 11

Figure 11:
FIG. 11 shows a layer structure.

FIG. 11 shows in cross section an example of a layer structure.

A lower layer is 20 µm PI 2611, a middle layer is 30 µm HD-7012, (30 µm=thickness chip+BCB layer) and an upper layer is 20 µm PI 2611. A difference in CTE (coefficient of thermal expansion) is also shown: 3 ppm for the lower and upper layers and 74 ppm for the middle layer. This symmetry of layers can lead to reduction of curling of substrate after release, compared to an arrangement without the upper layer. There will be some internal stress between the layers, but much lower than an ultimate stress for PI.

In conclusions, BCB has proved useful as bonding material, and adhesion problems with PI layers have been addressed by using PI on cured PI, by using BCB on PI, PI on BCB, and metallization of PI. As vias with diameters down to 35 μm or down to 20 μm are realized using a tripled YAG laser, chips with contact pitches down to 80 μm, or respectively 50 μm could be packaged using the UTCP process flow. The UTCP can provide an interposer, permitting the testing of the chip before embedding and providing a contact fan out with more relaxed pitches. UTCP is based on embedding of ultra-thin chips (with thickness below 30 μm) in polyimide. Wafer thinning down to 20-30 μm is still not common but a number of manufacturers have already presented equipment for this technology, and the first services offer such extreme wafer thinning and dicing.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method of manufacturing a semiconductor device, the method comprising the steps of:
    forming a first flexible film on a rigid carrier substrate; thereafter
    attaching a die to the first flexible film, wherein the die is positioned face-up on the first flexible film so as to leave contacts on the die exposed, and wherein a surface of the die attached to the first flexible film has no contacts; thereafter
    forming a wiring layer on the die to contact the contacts of the die while the die is attached to the first flexible film; and thereafter
    releasing the first flexible film from the rigid carrier substrate, wherein the first flexible film forms a part of a chip package.

2. The method of claim 1, further comprising steps of:
    forming a second flexible film to cover the die after the die has been attached to the first flexible film; and
    forming holes in the second flexible film to leave the contacts exposed.

3. The method of claim 2, wherein a combined thickness of the die, the first flexible film, the second flexible film, and the wiring layer is less than about 150 μm.

4. The method of claim 1, further comprising a step of gluing the die to the first flexible film.

5. The method of claim 1, wherein an area of the first flexible film where the die is attached has a lower adhesion to the rigid carrier substrate than another area of the first flexible film.

6. The method of claim 5, wherein the step of releasing comprises the step of cutting the first flexible film in the area of lower adhesion so as to release a part of the area of lower adhesion, and so as to leave an area of higher adhesion.

7. The method of claim 2, further comprising the steps of:
    forming at least one recess in at least one of the first flexible layer and second flexible layer, and
    situating the die in the recess.

8. The method of claim 1, wherein the first flexible film comprises a polyimide.

9. The method of claim 1, wherein the wiring layer comprises a fan-out of wires.

10. A method of manufacturing a semiconductor device, the method comprising the steps of:
    forming a first flexible film on a rigid carrier substrate, so that at least one area of the first flexible film has a lower adhesion to the rigid carrier substrate than another area of the flexible film; thereafter
    attaching a die to an area of the first flexible film having a lower adhesion to the carrier substrate, wherein the die is positioned face-up on the first flexible film, and wherein a surface of the die attached to the first flexible film has no contacts; and thereafter
    releasing the area of the first flexible film having a lower adhesion to the rigid carrier substrate from the carrier substrate, wherein the die and the area of the first flexible film having a lower adhesion to the rigid carrier substrate form a portion of a chip package.

11. A method of manufacturing a stack, the method comprising the steps of:
    manufacturing a plurality of semiconductor devices according to the method of claim 1; and
    arranging the semiconductor devices in a stack with electrical connections between semiconductor devices in the stack.

12. The method of claim 11, further comprising a step of testing the semiconductor devices after manufacture and before arranging them into a stack.

13. A stack of semiconductor devices prepared according to the method of claim 11.

14. The method of claim 1, wherein the chip package is an ultra-thin chip package having a thickness of less than 150 μm.

15. The method of claim 10, wherein the chip package has a thickness of less than 150 μm.

16. The method of claim 14, wherein the die is a silicon chip having a thickness of from 20 μm to 30 μm.

17. The method of claim 15, wherein the die is a silicon chip having a thickness of from 20 μm to 30 μm.

18. A method of manufacturing a semiconductor device, the method comprising the steps of:
    forming a first flexible film on a rigid carrier substrate; thereafter
    attaching a die to a portion of the first flexible film so as to leave contacts on the die exposed;
    forming a wiring layer on the die to contact the contacts of the die; and thereafter releasing the portion of the first flexible film to which the die is attached from the rigid carrier substrate, wherein the die and the portion of the first flexible film form a portion of a chip package.

19. The method of claim 18, wherein the die is positioned face-up on the first flexible film.

20. The method of claim 18, wherein the step of forming a wiring layer to contact the contacts of the die is carried out while the die is attached to the first flexible film.

21. A method of manufacturing a semiconductor device, the method comprising the steps of:

forming a first flexible film on a rigid carrier substrate, so that at least one area of the first flexible film has a lower adhesion to the rigid carrier substrate than another area of the flexible film; thereafter attaching a die to an area of the first flexible film having a lower adhesion to the carrier substrate; and thereafter releasing the area of the first flexible film having a lower adhesion to the rigid carrier substrate from the carrier substrate, wherein the die and the area of the first flexible film having a lower adhesion to the rigid carrier substrate form a portion of a chip package.

22. The method of claim 21, wherein the die is positioned face-up on the first flexible film.

* * * * *